United States Patent
Chen

(10) Patent No.: US 7,525,366 B2
(45) Date of Patent: Apr. 28, 2009

(54) OFFSET COMPENSATION USING NON-UNIFORM CALIBRATION

(75) Inventor: Chun-Ying Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 6 days.

(21) Appl. No.: 11/819,676

(22) Filed: Jun. 28, 2007

(65) Prior Publication Data

US 2009/0002053 A1    Jan. 1, 2009

(51) Int. Cl.
*H03L 5/00* (2006.01)
(52) U.S. Cl. .............. 327/307; 327/312; 327/316; 327/323; 327/331; 327/332
(58) Field of Classification Search ........... 327/307, 327/312, 316, 323, 331, 332
See application file for complete search history.

(56) References Cited

U.S. PATENT DOCUMENTS

| | | | |
|---|---|---|---|
| 4,395,732 A | * | 7/1983 | Upton .................. 348/27 |
| 2003/0071666 A1 | * | 4/2003 | Bailey ................. 327/131 |

* cited by examiner

*Primary Examiner*—Kenneth B Wells
*Assistant Examiner*—Daniel Rojas
(74) *Attorney, Agent, or Firm*—Sterne Kessler Goldstein & Fox, PLLC

(57) ABSTRACT

Methods and systems for offset compensation using calibration are provided. Embodiments enable offset compensation using non-uniform calibration. Embodiments enable calibration schemes configurable according to the probability distribution function (PDF) of the random offset. Embodiments enable calibration schemes configurable with multiple levels of calibration resolution according to the PDF of the random offset. Embodiments enable calibration schemes configurable with multiple calibration step values according to the PDF of the random offset. Embodiments can be implemented for various types of random offset, including, without limitation, Gaussian-, Bernoulli-, uniformly-, Chi-, exponentially-, Gamma-, and Pareto-distributed offset.

19 Claims, 8 Drawing Sheets

OFFSET COMPENSATION USING NON-UNIFORM CALIBRATION

BACKGROUND OF THE INVENTION

1. Field of the Invention

The present invention relates generally to offset compensation, and more particularly to offset compensation using non-uniform calibration.

2. Background Art

Device mismatch due to process and/or temperature variations can significantly affect the performance of analog and/or digital circuits. For instance, due to process variations, identically designed components (e.g., NMOS transistors, PMOS transistors, etc.) can have different geometry and/or electrical characteristics, even when located proximately to each other on the same silicon wafer. Consequently, a device formed using such components will have an inherent offset relative to an actual prototype, resulting in a degradation in the device performance.

One way to reduce the effects of device mismatch is by increasing the device size, thereby making component variations less significant. However, this correspondingly results in increased hardware complexity, circuit area, and cost.

Accordingly and since device mismatch is generally very difficult to avoid, offset compensation is another way to deal with device mismatch problems.

What is needed therefore are methods and systems for compensating for offset due to device mismatch.

BRIEF SUMMARY OF THE INVENTION

Methods and systems for offset compensation using calibration are provided herein.

Embodiments of the present invention enable offset compensation using non-uniform calibration.

Embodiments of the present invention enable calibration schemes configurable according to the probability distribution function (PDF) of the random offset.

Embodiments of the present invention enable calibration schemes configurable with multiple levels of calibration resolution according to the PDF of the random offset.

Embodiments of the present invention enable calibration schemes configurable with multiple calibration step values according to the PDF of the random offset.

Embodiments of the present invention can be implemented for various types of random offset, including, without limitation, Gaussian-, Bernoulli-, uniformly-, Chi-, exponentially-, Gamma-, and Pareto-distributed offset.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. Generally, the drawing in which an element first appears is typically indicated by the leftmost digit(s) in the corresponding reference number.

DETAILED DESCRIPTION OF EMBODIMENT(S)

Overview

Methods and systems for offset compensation using calibration are provided herein.

Embodiments of the present invention enable offset compensation using non-uniform calibration.

Embodiments of the present invention enable calibration schemes configurable according to the probability distribution function (PDF) of the random offset.

Embodiments of the present invention enable calibration schemes configurable with multiple levels of calibration resolution according to the PDF of the random offset.

Embodiments of the present invention enable calibration schemes configurable with multiple calibration step values according to the PDF of the random offset.

Embodiments of the present invention can be implemented for various types of random offset, including, without limitation, Gaussian-, Bernoulli-, uniformly-, Chi-, exponentially-, Gamma-, and Pareto-distributed offset.

Detailed description of embodiments of the present invention will now be provided.

Offset Compensation Using Non-Uniform Calibration

In the following description, embodiments of offset compensation using non-uniform calibration will be provided. For the purpose of illustration, some of the embodiments represent the offset in voltage terms. These embodiments are provided for the purpose of illustration and are not limiting.

Further, for the purpose of illustration, some of the embodiments will be described with respect to particular circuits and/or devices, including analog-to-digital converters, for example. These embodiments are provided for the purpose of illustration and are not limiting. As would be understood by a person skilled in the art based on the teachings herein, embodiments of the present invention can be extended to any circuit and/or device that would benefit from non-uniform calibration.

Figure 1:
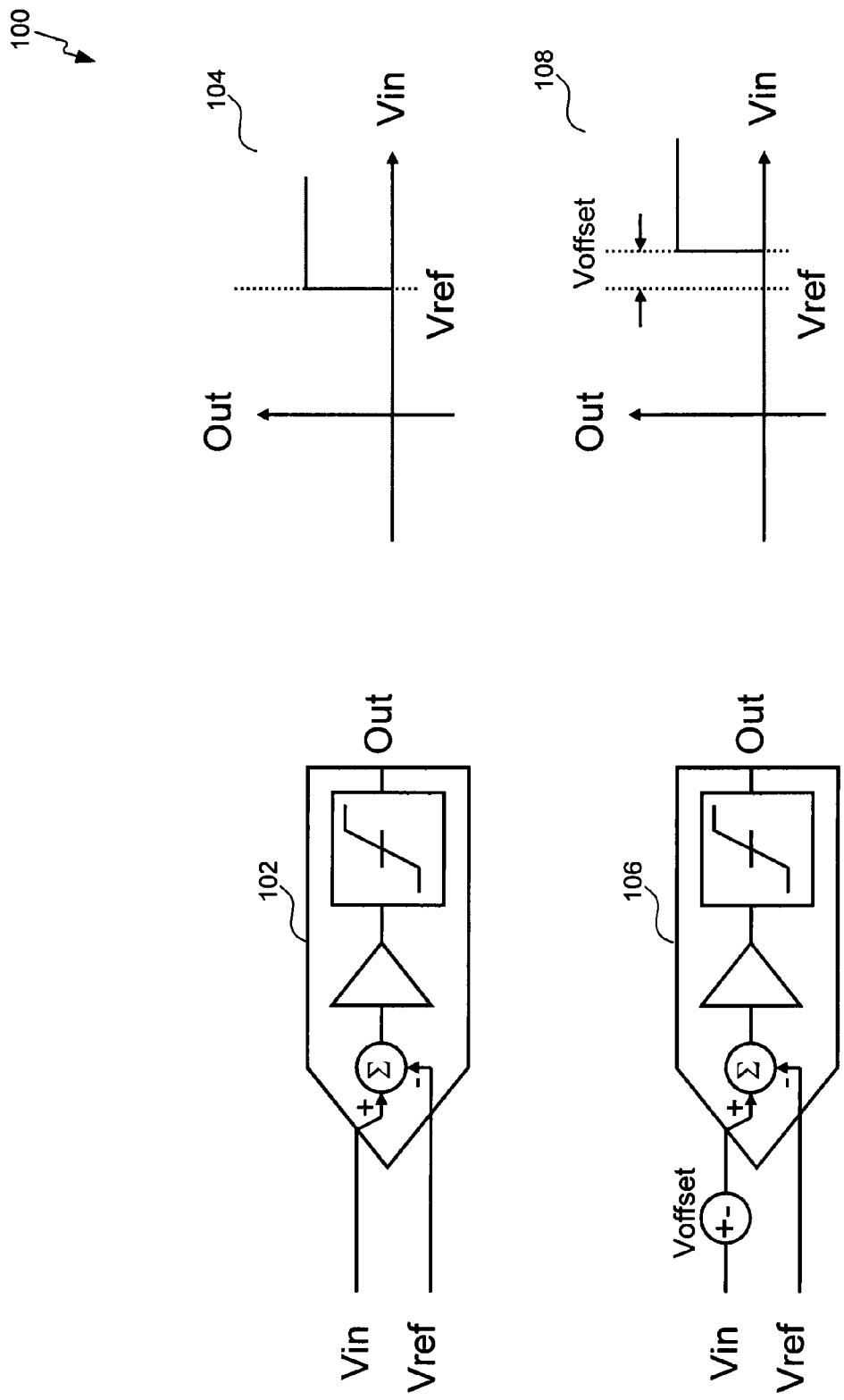
FIG. 1 is an example that illustrates example offset effects.

FIG. 1 is an example 100 that illustrates example offset effects. For purposes of illustration, offset is described in voltage terms. Also, for purposes of illustration, example 100 illustrates offset effects with respect to a one bit Analog-to-Digital Converter (ADC).

A one bit ADC, as illustrated by ADCs 102 and 106 in FIG. 1, is a two-input device that receives an input voltage $V_{in}$ and a reference voltage $V_{ref}$ and outputs a logical output based on the magnitude of the input voltage relative to that of the reference voltage. For example, if the input voltage $V_{in}$ is larger than the reference voltage $V_{ref}$, the ADC outputs a logical high, and vice versa.

ADC 102 illustrates an ideal ADC. As illustrated by its transfer characteristic function 104, the output of ADC 102 switches from a logical low to a logical high immediately as the input voltage $V_{in}$ exceeds the reference voltage $V_{ref}$. In practice, however, ideal devices, such as ADC 102, are improbable.

On the other hand, ADC 106 is an example ADC that is typically encountered in practice. Due to device mismatch, which may be caused by temperature and/or process variations, ADC 106 inherently includes an offset voltage $V_{offset}$. $V_{offset}$ is representative of an offset voltage inherent in the ADC and not an actual applied voltage. This offset voltage can be practically represented, as illustrated in FIG. 1, as a positive/negative voltage added to the input voltage $V_{in}$, resulting in an horizontal shift of the transfer characteristic function of the ADC. For example, as shown in plot 108, a negative offset voltage within ADC 106 causes the output of ADC 106 to remain at a logical low until the input voltage $V_{in}$ exceeds the sum of the reference voltage $V_{ref}$ and the offset voltage $V_{offset}$.

Figure 2:
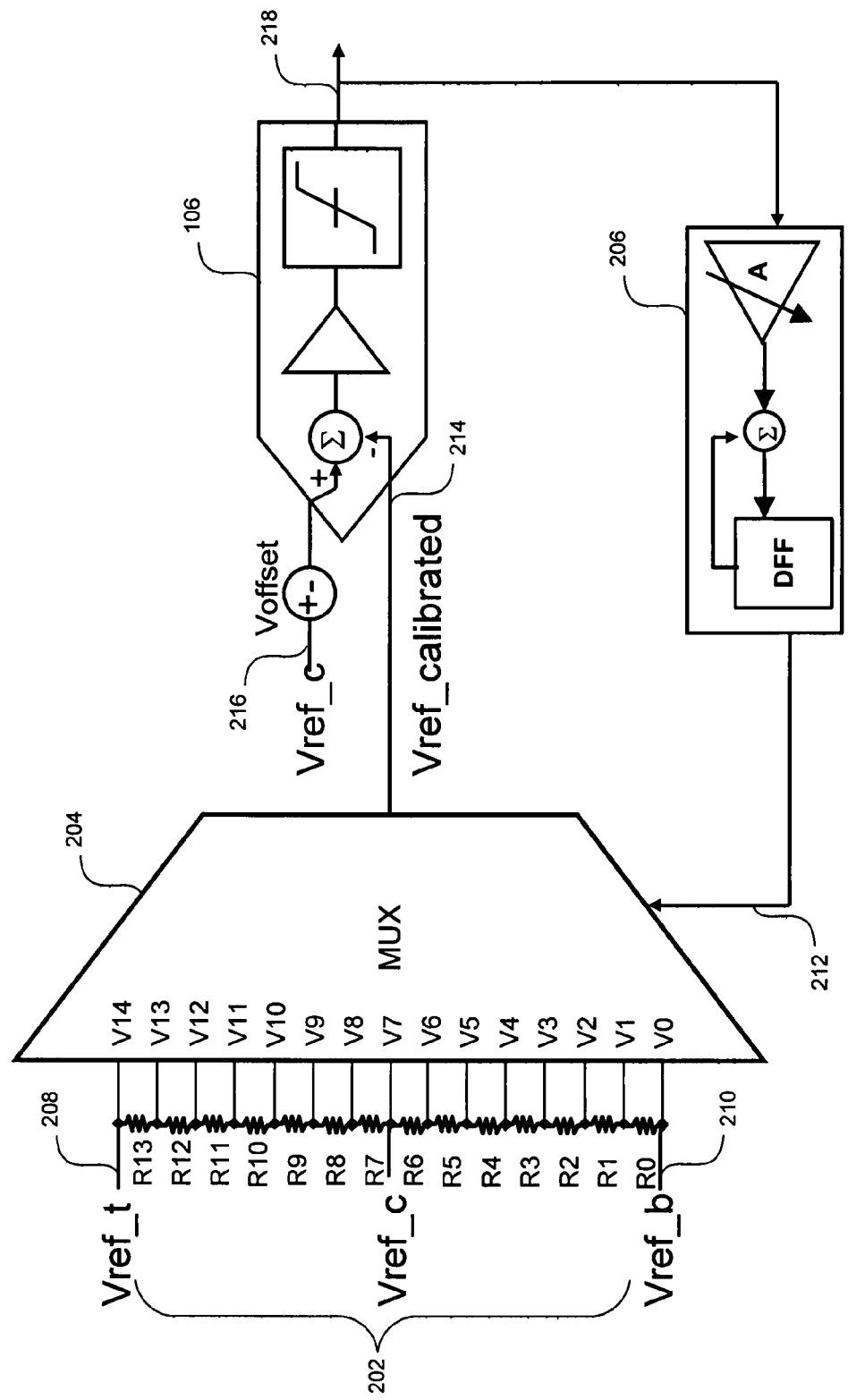
FIG. 2 illustrates a calibration system that can be used for offset compensation.

Since the offset is inherent within the device, offset compensation can be achieved through calibration. FIG. 2 illustrates an example calibration system 200 that can be used for offset compensation. Calibration system 200 works by calibrating the reference voltage used by the device to compensate for the offset within the device. For example, if the offset within the device causes an effective decrease in the received input voltage, an equivalent decrease in the reference voltage would compensate for that offset. Calibration system 200 is described below with respect to ADC 106 of FIG. 1.

Calibration system 200 includes a resistor ladder network 202, a multiplexer 204, and a digital calibration circuit 206.

Resistor ladder network 202 includes a plurality of series-coupled resistors $R_0, \ldots, R_{13}$ and provides a plurality of taps for output of respective voltages. In an embodiment, voltage signals $V_{ref\_t}$ 208 and $V_{ref\_b}$ 210 are coupled at respective ends of the resistor network (illustrated as $V_{ref\_t}$ and $V_{ref\_b}$ in FIG. 2) to enable a calibration voltage range $V_0, \ldots, V_{14}$ at the plurality of taps. The calibration voltage range can be symmetrically centered around the reference voltage or, alternatively, it can be skewed with respect to the reference voltage.

The taps of resistor network 202 form inputs to multiplexer 204. In example system 200, multiplexer 204 is a 15:1 multiplexer. Generally, the size of multiplexer 204 depends on the required width and resolution of the calibration voltage range. Multiplexer 204 also receives a control signal 212 from digital calibration circuit 206 at its select input node. Control signal 212 controls multiplexer 204 to select one of its inputs for output. Typically, control signal 212 includes $\lceil \log_2 N \rceil$ bits, where N is number of inputs of multiplexer 204.

In calibration mode, the output of multiplexer 204, denoted as signal $V_{ref\_calibrated}$ 214, is coupled to the reference voltage input port of ADC 106. A voltage signal $V_{ref\_c}$ 216, which is equal to the reference voltage used by ADC 106, is coupled to the input voltage input port of ADC 106.

Since an offset within ADC 106 causes an effective increase/decrease in the voltage coupled to the input port of ADC 106, the goal of calibration is to determine a calibrated reference voltage such that when applied to ADC 106 both the input voltage and the reference voltage effectively see the same offset. In example system 200, this calibrated reference voltage is represented by $V_{ref\_calibrated}$ 214 and is determined through an iterative process, which terminates when $V_{ref\_calibrated}$ 214 is substantially equal to $V_{ref\_c}$ 216 with the added offset.

Calibration begins by selecting a value for $V_{ref\_calibrated}$ 214 from the calibration voltage range $V_0, \ldots, V_{14}$. For example, calibration may begin with selecting $V_{ref\_calibrated}$ 214 equal to $V_{ref\_c}$ or equivalently voltage $V_7$ of from the calibration range $V_0, \ldots, V_{14}$ enabled by resistor network 202.

ADC 106 compares the selected $V_{ref\_calibrated}$ 214 and $V_{ref\_c}$ 216 with the added offset and outputs a logical low or a logical high at its output 218 based on the result of the comparison. If output 218 of ADC 106 is a logical high, $V_{ref\_calibrated}$ 214 is lower than $V_{ref\_c}$ 216 with the added offset and is subsequently increased. Otherwise, if output 218 of ADC 106 is a logical low, $V_{ref\_calibrated}$ 214 is larger than $V_{ref\_c}$ 216 with the added offset and is subsequently decreased.

Accordingly, this process is iteratively repeated until $V_{ref\_calibrated}$ 214 and $V_{ref\_c}$ 216 with the added offset are substantially equal. In practice, this is identified when for a given value of $V_{ref\_calibrated}$ 214, output 218 of ADC 106 fluctuates (due to noise) between a logical low and a logical high instead of settling at one logical level or another, signaling that $V_{ref\_calibrated}$ 214 and $V_{ref\_c}$ 216 are substantially close to each other.

In example system 200, this iterative process is implemented using a feedback loop that includes digital calibration circuit 206. Digital calibration circuit 206 receives output 218 of ADC 106 and generates control signal 212 to control multiplexer 204. In an embodiment, digital calibration circuit 206 examines output 218 of ADC 106 to determine whether it is a logical high or a logical low and, accordingly, generates control signal 212 to cause multiplexer 204 to increase/decrease the value of its output 214. For example, when calibration circuit 206 determines that output 218 of ADC 106 is a logical high, it generates control signal 212 such as to cause multiplexer 204 to increase its output from its current voltage value to the next higher voltage value within the calibration voltage range $V_0, \ldots, V_{14}$. In an embodiment, digital calibration circuit 206 includes a means to retrieve the last value embedded in control signal 212 and to increase/decrease it according to output 218 of ADC 106. In an embodiment, as illustrated in FIG. 2, digital calibration circuit 206 includes a variable amplifier and a discrete Fourier filter.

The calibration process ends, as described above, when $V_{ref\_calibrated}$ 214 converges to a value that causes output 218 of ADC 106 to fluctuate (due to noise) between a logical low and a logical high instead of settling at one logical level or another. When this occurs, digital calibration circuit 206 locks control signal 212 to its current value. The value of $V_{ref\_calibrated}$ 214 associated with this value of control signal 212 represents the calibrated reference voltage to be applied to ADC 106.

Generally, calibration accuracy depends on several parameters including the width and the resolution of the calibration voltage range enabled by resistor network 202. A wide range allows for the calibration of an offset with a widely spread distribution. On the other hand, a fine resolution allows for a more accurate determination of the calibrated reference voltage. Typically, the width and the resolution of the calibration voltage range enabled by resistor network 202 are directly related to the resistance distribution or configuration of resistor values within resistor network 202.

Theoretically, the width and the resolution of the calibration voltage range can be both increased by increasing the size of resistor network 202 and, correspondingly, the bit size of control signal 212. In practice, however, this results in increased hardware complexity, circuit area, and cost, and a limited size resistor network 202 with a fixed number of resistors is generally available. With that, a tradeoff exists between the width and the resolution of the calibration voltage range. For example, with a larger voltage step (larger resistors' value) within resistor network 202, a wider calibration voltage range but lower resolution can be achieved. Conversely, with a smaller voltage step (smaller resistors' value) within resistor network 202, a finer resolution but a narrower calibration voltage range can be achieved.

Figure 3:
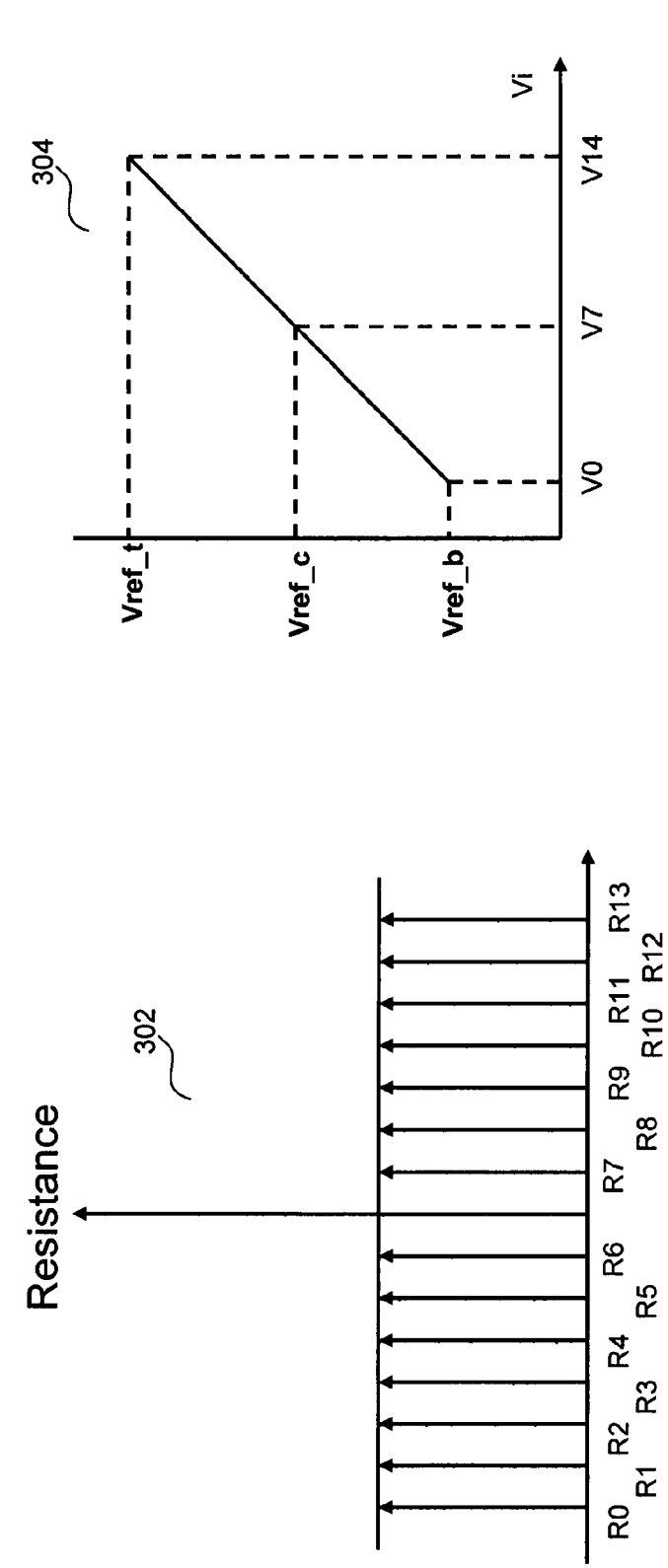
FIG. 3 illustrates an example resistance configuration of the resistor network of FIG. 2 and an associated calibration function.

FIG. 3 illustrates an example 300 of a resistance configuration 302 of resistor network 202 and an associated calibration voltage function 304.

Resistance configuration 302 uses a uniform distribution of resistance values across resistor network 202 such that all resistors within resistor network 202 have substantially equal values. Accordingly, resistance configuration 302 results in a constant voltage step between any two successive taps of resistor network 202. In an embodiment, the voltage step is equal to the desired width of the calibration voltage range divided by ($2^M-1$), where M is the bit size of control signal 212. The voltage step may be smaller or larger in other embodiments.

Further, as a result of having a constant voltage step, resistance configuration 302 is characterized by a linear calibration voltage function 304, whereby the calibrated reference voltage $V_{ref\_calibrated}$ 214 follows a linear trajectory as the calibration voltage range $V_0, \ldots, V_{14}$ is traversed. As a result, resistance configuration 302 enables uniform resolution across the entire calibration voltage range of the calibrated reference voltage.

Resistance configuration 302 is suitable for cases where the offset is uniformly distributed over an offset range such that the final value of the calibrated reference voltage is uniformly distributed over the calibration voltage range. In practice, however, the offset is generally not uniformly distributed over the offset range but follows a non-uniform distribution.

Figure 4:
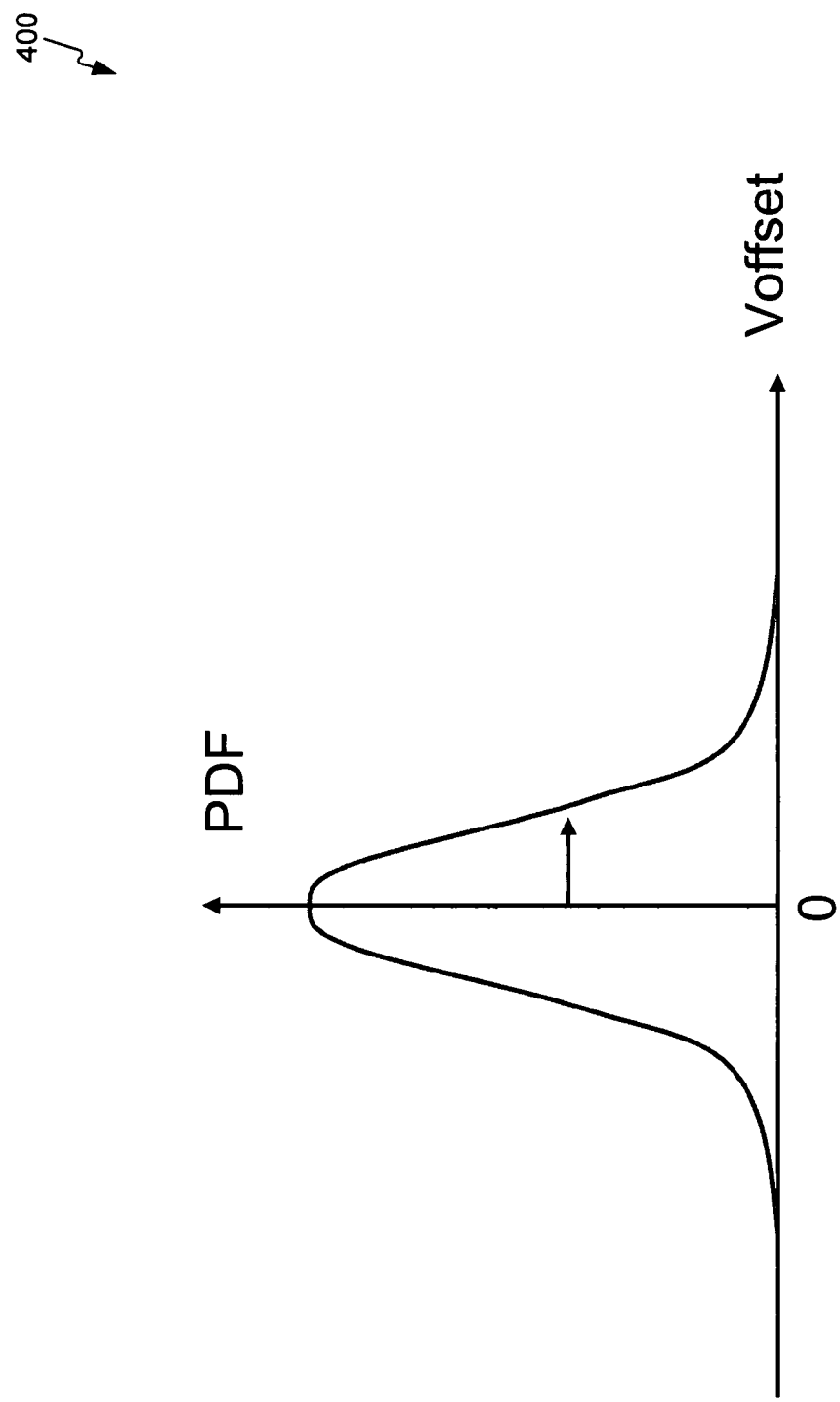
FIG. 4 illustrates a probability distribution function of an offset voltage.

In certain cases, as illustrated in FIG. 4, the offset follows a Gaussian probability distribution function (PDF), whereby the offset has a higher probability of being closer to a mean value of the distribution than farther away. Similarly, as a result, the calibrated reference voltage will have a higher probability of being closer to a center value of the calibration range (illustrated as $V_{ref\_c}$ in FIG. 2) than to the boundaries of the calibration range. Indeed, the calibrated reference voltage will follow a Gaussian PDF having equal variance but a shifted mean relative to the PDF of the offset.

Figure 5:
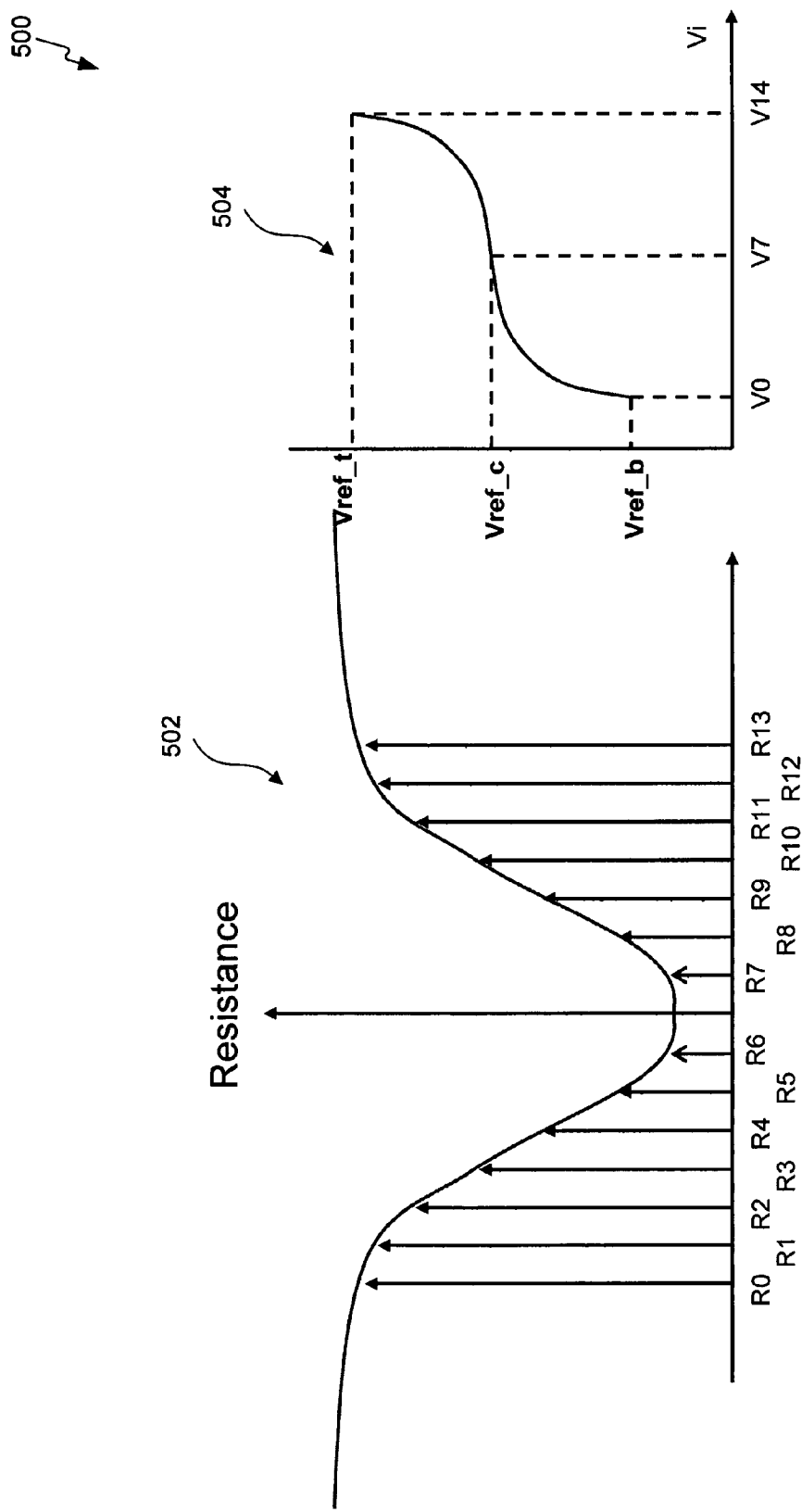
FIG. 5 illustrates another example resistance configuration of the resistor network of FIG. 2 and an associated calibration function.

Accordingly, offset compensation can be more efficiently performed if calibration accuracy is varied according to the expected PDF of the calibrated reference voltage (or equivalently the PDF of the offset). This can be achieved by designing resistor network 202 to enable variable resolution across the calibration voltage range as a function of the PDF of the calibrated reference voltage (or equivalently the PDF of the offset). In other words, resistor network 202 substantively tracks the offset. In an embodiment, the higher is the probability of the calibrated reference voltage falling within an interval of the calibration range, the finer is the resolution enabled within that interval. As FIG. 5 illustrates an example 500 of a resistance configuration 502 of resistor network 202 and an associated calibration voltage function 504.

Resistance configuration 502 uses a non-uniform distribution of resistance values across resistor network 202 such that resistance values increase as resistors are further from the center tap of resistor network 202 (illustrated as $V_{ref\_c}$ in FIG. 2). In an embodiment, resistance configuration 502 follows an inverse Gaussian distribution.

Accordingly, resistance configuration 502 results in a variable voltage step, which may vary between successive taps of resistor network 202. Further, the voltage step increases moving away from the center tap of resistor network 202. Therefore, resistance configuration 502 enables fine resolution when the calibrated reference voltage is near the center of the calibration voltage range, while allowing a wide calibration range due to larger resistance values approaching the ends of resistor network 202.

Calibration voltage function 504 illustrates the non-uniform resolution enabled by resistance configuration 502. As illustrated, the slope of function 504 tends to zero as the calibrated reference voltage approaches the center value of the calibration range but increases as the reference voltage approaches either end of the calibration range.

Figure 6:
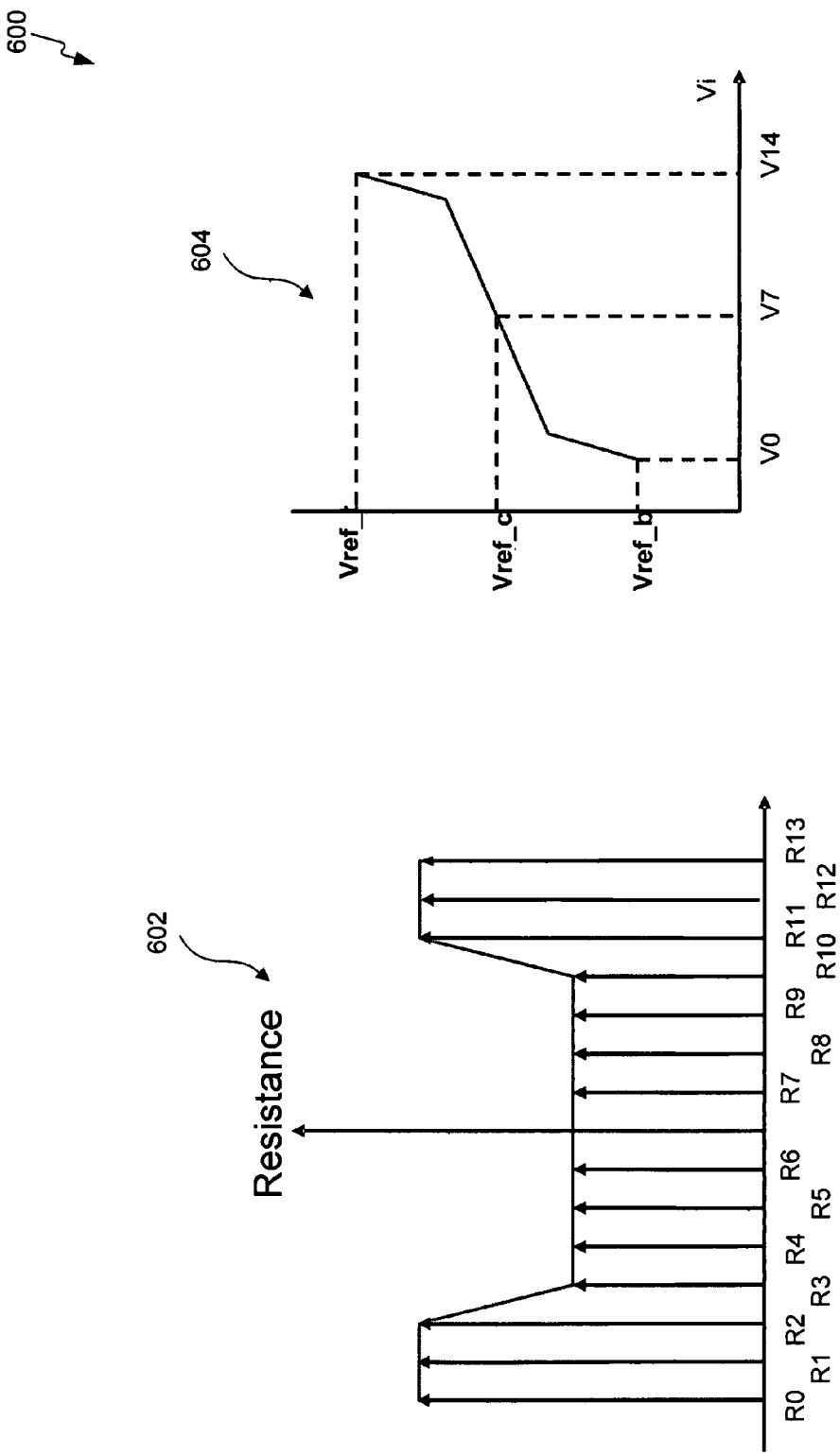
FIG. 6 illustrates another example resistance configuration of the resistor network of FIG. 2 and an associated calibration function.

FIG. 6 illustrates an example 600 of another resistance configuration 602 of resistor network 202 and an associated calibration voltage function 604.

Similar to resistance configuration 502, resistance configuration 602 uses a non-uniform distribution of resistance values across resistor network 202. Resistance configuration 602, however, uses only two resistance values as illustrated in FIG. 6, resulting in two voltage step values and corresponding resolution levels within the calibration voltage range. In an embodiment, the voltage step values increase and the corresponding resolution levels decrease, moving away from the center tap of resistor network 202.

Calibration voltage function 604 illustrates the two levels of resolution enabled by resistance configuration 602. As illustrated, function 604 has a first slope value within a center interval of the calibration voltage range but a second higher slope value as the calibrated reference voltage approaches each end of the calibration range. The different slope values indicate that the resolution varies within the calibration voltage range.

Figure 7:
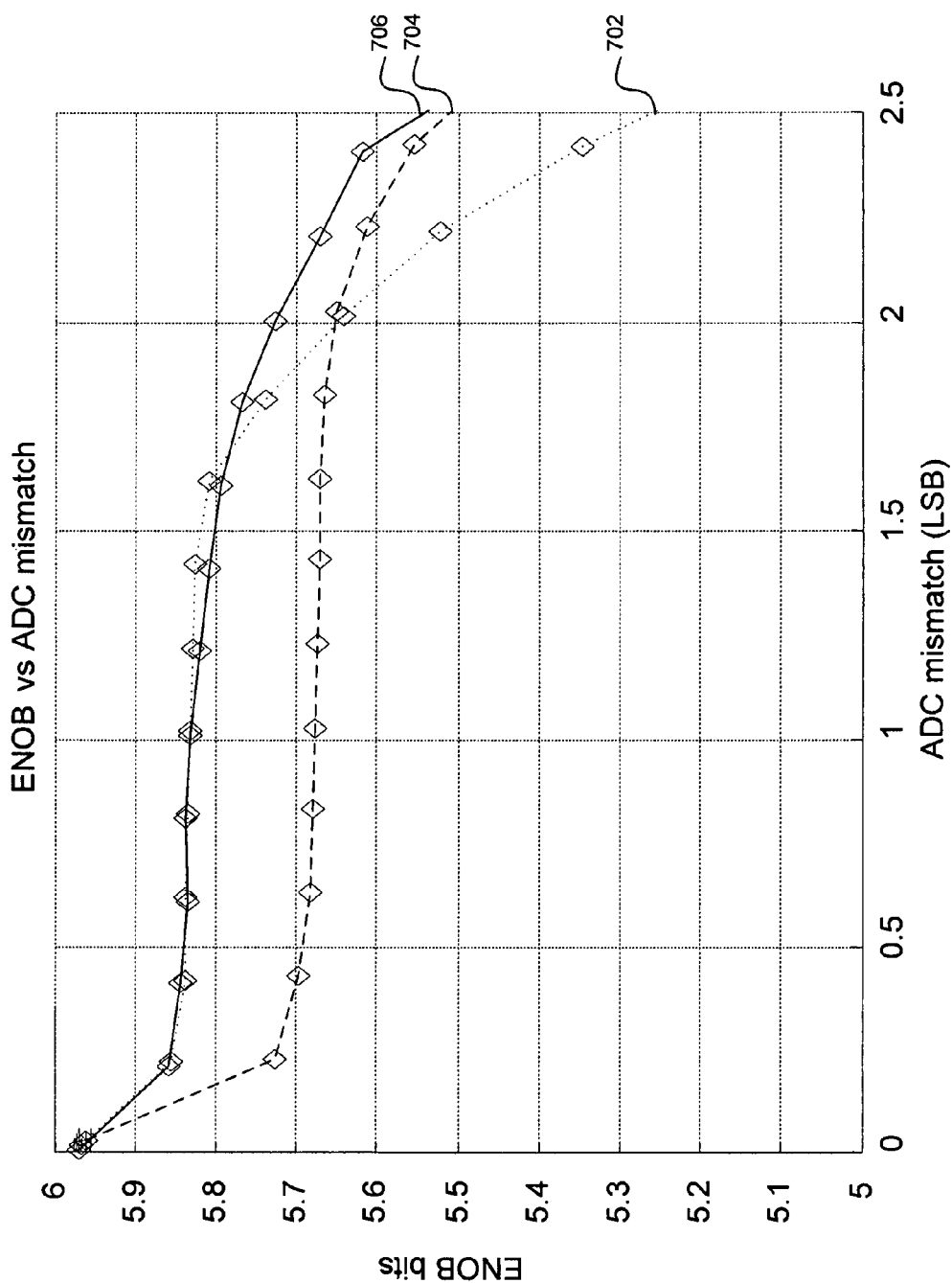
FIG. 7 is an example performance evaluation of various calibration schemes for offset compensation.

FIG. 7 is an example performance evaluation of various calibration schemes for offset compensation.

The graph of FIG. 7 simulates the effective number of bits (ENOB) of a 6-bit ADC versus ADC mismatch. ENOB measures the effective resolution of an ADC and is typically affected by the ADC mismatch. The ADC mismatch represents the offset within the ADC due to temperature and/or process variations. In FIG. 7, the ADC mismatch represents the standard deviation of the (Gaussian) offset and is normalized to LSB (least significant bit) units, where 1 LSB (Volt) is equal to the input voltage range of the ADC divided by the resolution of the ADC (6 bits in this case).

The 6-bit ADC is built using 63 one bit ADCs similar to ADC 106 of FIG. 1. Each of the 63 ADC slices provides up to 31 (+/−15 and 0) values of calibrated reference voltage.

Plots 702 and 704 illustrate the performance of uniform calibration schemes, such as the scheme described in FIG. 3. These schemes, as described above, use fixed voltage step values to calibrate the ADC.

Plot 702 represents the performance of a calibration scheme having a fixed voltage step value equal to 0.25 LSB. Since its voltage step is relatively small, the scheme performs relatively well when the ADC mismatch is low, achieving an ENOB of approximately 5.85 when the ADC mismatch is less than 1.5 LSB. However, when the mismatch increases (e.g., becomes larger than approximately 1.75 LSB), the voltage step of 0.25 LSB becomes too small to provide the required calibration voltage range and performance quickly deteriorates.

Plot 704 represents the performance of a calibration scheme having a fixed voltage step value equal to 0.33 LSB. Having a larger voltage step value than the scheme represented by plot 702, this scheme has a relatively constant performance across the simulated ADC mismatch range. However, due to its larger voltage step value, it provides lower calibration resolution and, consequently, lower ENOB performance.

Plot 706 represents the performance of a non-uniform calibration scheme, such as the scheme described in FIG. 6. In the example simulation of FIG. 7, the non-uniform calibration scheme implements two step voltage values of 0.25 LSB and 0.5 LSB. The lower step voltage value (0.25 LSB) is used for the first ten steps moving away from the center tap of the resistor network, in each direction. The higher step voltage value (0.5 LSB) is used for the remaining five outer steps at each end of the resistor network.

As illustrated in FIG. 7, the non-uniform calibration scheme outperforms both uniform calibration schemes in terms of both ENOB level and constancy of performance.

Embodiments above of the present invention have been described with respect to a Gaussian distributed offset. These embodiments are provided for the purpose of illustration and are not limiting. As would be understood by a person skilled in the art based on the teachings herein, embodiments of the present invention can be extended to compensate for offsets having other types of probability distribution functions, continuous and discrete, and including, without limitation, Bernoulli distributions, uniform distributions, Chi distributions, exponential distributions, Gamma distributions, and Pareto distributions. As such, corresponding embodiments of resistance configurations and calibration schemes may vary, though remain within the scope of embodiments of the present invention.

Figure 8:
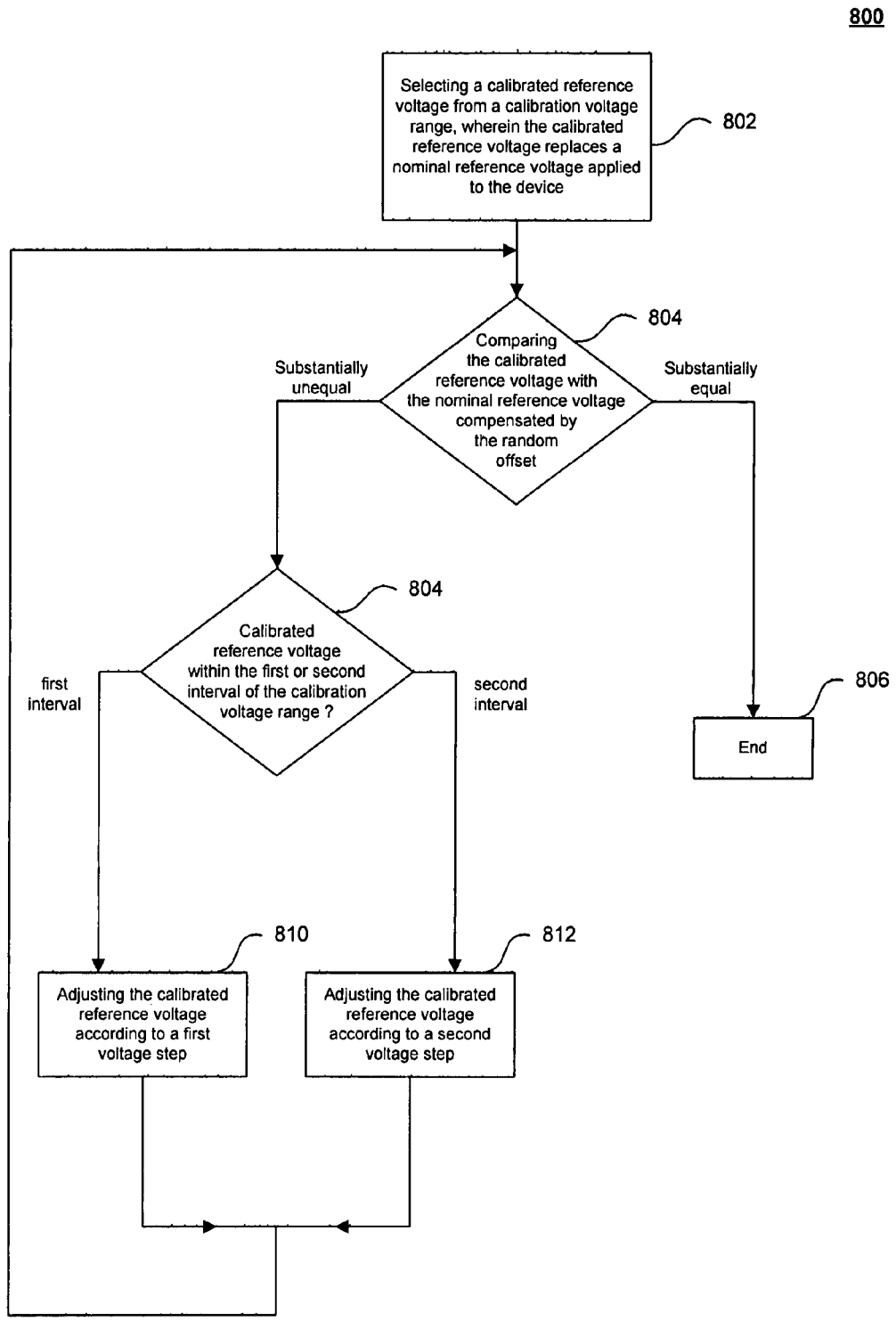
FIG. 8 is a process flowchart of a method for calibrating a device to compensate for a random offset.

FIG. 8 is a process flowchart 800 of a method for calibrating a device to compensate for a random offset.

Process 800 begins in step 802, which includes selecting a calibrated reference voltage from a calibration voltage range, wherein the calibrated reference voltage replaces a nominal reference voltage applied to the device to compensate for the random offset. In an embodiment, the calibration voltage range includes a plurality of voltage values, wherein voltage steps between successive voltage values are non-uniform. In another embodiment, the calibration voltage range includes a plurality of voltage values, wherein voltage steps between successive voltage values increase moving away from a median voltage value of the calibration voltage range. In another embodiment, the calibration voltage range includes a plurality of voltage values, wherein voltage steps between successive voltage values decrease moving away from a median voltage value of the calibration voltage range. In another embodiment, the calibration voltage range includes a plurality of voltages values, wherein voltage steps between successive voltage values are configured according to a probability distribution function (PDF) of the random offset.

Referring back to process 800, step 804 includes comparing the calibrated reference voltage with the nominal reference voltage compensated by the random offset. In an embodiment, the nominal reference voltage is used as an input to the device, thereby being affected by the random offset.

If the compared voltages in step 804 are substantially equal, process 800 proceeds to step 806 where it terminates. The calibrated reference voltage when step 806 is reached is then applied to the device, thereby compensating for the random offset within the device.

On the other hand, if the compared voltages in step 804 are substantially unequal, process 800 proceeds to step 808, where the calibrated reference voltage is adjusted.

In an embodiment, the calibrated reference voltage is adjusted according to a first or a second voltage step depending on the current value of the calibrated reference voltage with respect to the calibration voltage range. In an embodiment, the first and second voltage steps are selected according to a probability distribution function (PDF) of the random offset.

As such, step 808 includes determining whether the calibrated reference voltage falls within a first or a second interval of the calibration voltage range.

If the calibrated reference voltage falls within the first interval of the calibration voltage range, process 800 proceeds to step 810, which includes adjusting the calibrated reference voltage according to the first voltage step. Alternatively, if the calibrated reference voltage falls within the second interval of the calibration voltage range, process 800 proceeds to step 812, which includes adjusting the calibrated reference voltage according to the second voltage step. Subsequently, process flowchart 800 returns to step 804, described above.

Process flowchart 800 proceeds iteratively as illustrated in FIG. 8 until the termination condition occurs when the compared voltages in step 804 are substantially equal.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system for offset compensation, comprising:
  a resistor ladder network having a plurality of series-coupled resistors and providing a plurality of taps for output of respective voltages; and
  a multiplexer coupled to said resistor ladder network and providing as output a calibrated reference voltage selected from said respective voltages and configured to compensate for an offset within an attached device;
  wherein resistance values of said series-coupled resistors are configured according to a probability distribution function (PDF) of said offset.

2. The system of claim 1, further comprising:
  a feedback circuit coupled between an output of said attached device and a select input node of said multiplexer.

3. The system of claim 2, wherein said feedback circuit comprises a digital calibration circuit configured to monitor said output of said attached device and to control said calibrated reference voltage according to said output.

4. The system of claim 1, wherein said calibrated reference voltage is coupled to a reference voltage input port of said attached device and a nominal reference voltage is coupled to an input voltage input port of said attached device.

5. The system of claim 1, wherein said respective voltages form a non-uniform calibration voltage range for said calibrated reference voltage.

6. The system of claim 5, wherein said calibration voltage range comprises two or more voltage step values according to said PDF of said offset.

7. The system of claim 5, wherein said calibration voltage range enables two or more levels of calibration resolution according to said PDF of said offset.

8. The system of claim 5, wherein said calibration voltage range enables a first calibration resolution when said offset is within a first interval of an offset range and a second calibration resolution when said offset is within a second interval of said offset range.

9. The system of claim 8, wherein said first calibration resolution is higher than said second calibration resolution when said offset is more likely to fall within said first interval than said second interval.

10. The system of claim 1, wherein said resistance values of said series-coupled resistors are non-uniform.

11. The system of claim 1, wherein said resistance values of said series-coupled resistors increase as said resistors are further from a center tap of said resistor ladder network.

12. The system of claim 1, wherein said resistance values of said series-coupled resistors decrease as resistors are further from a center tap of said resistor ladder network.

13. The system of claim 1, wherein said resistance values of said series-coupled resistors are configured according to a continuous (PDF) of said offset.

14. The system of claim 1, wherein said resistance values of said series-coupled resistors are configured according to a discrete (PDF) of said offset.

15. The system of claim 1, wherein said resistance values of said series-coupled resistors are configured according to a Gaussian PDF of said offset.

16. The system of claim 1, wherein said resistance values of said series-coupled resistors are configured according to an inverse Gaussian distribution.

17. The system of claim 1, wherein said resistance values of said series-coupled resistors are configured according to one of:

a Bernoulli PDF of said offset;

a Chi PDF of said offset;

an exponential PDF of said offset;

a Gamma PDF of said offset; and a Pareto PDF of said offset.

18. The system of claim 1, wherein said offset within said attached device is due to temperature and/or process variations.

19. The system of claim 1, wherein said attached device is an analog-to-digital converter (ADC).

* * * * *